(12) United States Patent
Souetinov et al.

(10) Patent No.: US 6,597,899 B2
(45) Date of Patent: *Jul. 22, 2003

(54) IMAGE REJECT MIXER CIRCUIT ARRANGEMENTS

(75) Inventors: Viatcheslav I Souetinov, Swindon (GB); Stephen P Graham, Swindon (GB)

(73) Assignee: Mitel Semiconductor Limited, Wiltshire (GB)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/185,838

(22) Filed: Nov. 4, 1998

(65) Prior Publication Data

US 2002/0058492 A1 May 16, 2002

(30) Foreign Application Priority Data

Nov. 7, 1997 (GB) .............................................. 9723486

(51) Int. Cl.$^7$ ................................................ H04B 1/26
(52) U.S. Cl. ..................... 455/323; 455/324; 455/302; 455/326; 455/327; 455/304; 455/285; 375/279; 375/329; 375/330; 375/332
(58) Field of Search ................................ 455/323, 324, 455/326, 311, 302, 303, 304, 285, 313; 327/116; 375/279–330, 332, 308

(56) References Cited

U.S. PATENT DOCUMENTS

| | | | | |
|---|---|---|---|---|
| 5,127,102 A | * | 6/1992 | Russell ........................ | 455/327 |
| 5,140,198 A | | 8/1992 | Atherly et al. | |
| 5,532,637 A | | 7/1996 | Khoury et al. | |
| 5,852,772 A | * | 12/1998 | Lampe et al. ............. | 455/226.2 |
| 5,859,559 A | * | 1/1999 | Hong et al. .................. | 327/359 |
| 5,901,349 A | * | 5/1999 | Guegnaud et al. .......... | 455/302 |
| 5,929,710 A | * | 7/1999 | Bien ........................... | 330/301 |
| 5,950,119 A | * | 9/1999 | Mcgeehan et al. .......... | 455/302 |
| 5,974,306 A | * | 10/1999 | Hornak et al. .............. | 455/323 |
| 5,983,082 A | * | 11/1999 | Hilbert ........................ | 455/76 |
| 6,111,463 A | * | 8/2000 | Kimura ....................... | 330/254 |
| 6,308,058 B1 | * | 10/2001 | Souetinov et al. .......... | 455/326 |

FOREIGN PATENT DOCUMENTS

| | | |
|---|---|---|
| DK | 44 25 336 | 9/1995 |
| EP | 0 779 704 A1 | 12/1996 |
| GB | 2 078 038 A | 6/1981 |
| GB | 2 247 797 A | 3/1992 |
| WO | WO 91/03883 | 3/1991 |

* cited by examiner

*Primary Examiner*—Edward F. Urban
*Assistant Examiner*—Marceau Milord
(74) *Attorney, Agent, or Firm*—Kirschstein, et al.

(57) ABSTRACT

An image reject mixer arrangement 1 comprises a transconductor 2, first and second mixer cores 3 and 4, first and second phase shifters 5 and 6 and a summer or combiner 7. The mixer arrangement 1 receives a single-ended RF voltage signal on a terminal 8, a differential local oscillator signal on I-LO terminals indicated at 9 and a 90° phase shifted differential local oscillator signal on Q-LO terminals 10, and provides differential IF output signals on output terminals 11. From the output of the transconductor 2 to the output of the combiner 7, the image reject mixer arrangement 1 carries signals in what can be described as a "current mode", i.e. it is the current, not the voltage, which conveys the desired signal. In this current mode, it is advantageous to provide each active circuit block with a high output impedance and a low input impedance wherever possible. This is achieved by the cascode connection of the transistors of the transconductor 2 with the transistors of the mixer cores 3 and 4; and the cascode connection of the transistors of the of the mixer cores 3 and 4 with the transistors of the combiner 7. This is advantageous in providing improved noise performance, linearity and current consumption in comparison with cascade connected mixer arrangement circuit blocks.

20 Claims, 4 Drawing Sheets

IMAGE REJECT MIXER CIRCUIT ARRANGEMENTS

FIELD OF THE INVENTION

The present invention relates to image reject mixer circuit arrangements and in particular, although not exclusively, to image reject mixer circuit arrangements suitable for integrated circuit implementation in radio receivers for radio telephones.

BACKGROUND OF THE INVENTION

Image reject mixers are preferred to conventional mixers for use in miniaturized radio receiver applications because image reject filters required by the conventional mixers tend to be both bulky and expensive. However, known image reject mixer have tended to demand significant current levels, in comparison with conventional mixers, because of the larger number of circuit blocks involved, which are generally connected in cascade. This is undesirable in battery powered radio equipment in that their use provides unwanted drain on the battery's charge, of particular significance in radiotelephones where battery replacement or re-charging frequency is desired to be low. UK Patent Application numbers 9724435.4 and 9700485.7 disclose the cascode connection of certain image reject mixer arrangement circuit blocks to reduce overall current consumption.

SUMMARY OF THE INVENTION

In accordance with a first aspect of the present invention, there is provided an image reject mixer circuit arrangement comprising input means to receive an input signal and to provide on each of first and second paths differential current signals derived from the input signal, the first and second paths each including a current mode mixer core arranged to mix the differential current signals with respective ones of In-phase and Quadrature local oscillator signals, and at least one of the first and second paths including phase shifter means to introduce a phase shift of the signal in the respective path compared to a signal in the opposite path, and current mode combiner means arranged to combine the signals from the first and second paths to provide an output signal.

Each of said first and second paths may include a phase shifter circuit.

Preferably, transistors forming part of the transconductor means are connected in cascode with transistors forming part of the quadrature mixer means. Further, transistors forming part of the quadrature mixer means are preferably connected in cascode with transistors forming part of the combiner means.

Said input means may comprise a low voltage headroom transconductor having differential inputs and a relatively low gain and a high gain pre-amplifier arranged to receive an or the single-ended input signal and to provide amplified and phase-split signals therefrom to the differential inputs of the transconductor means.

In accordance with a second aspect of the present invention, an image reject mixer circuit arrangement comprises transconductor means, quadrature mixer means, phase shifter means and combiner means connected in series across a voltage supply, the transconductor means providing first and second current signals on first and second paths respectively, each of the first and second current signals being representative of an input signal, to respective ones of an in-phase and a quadrature mixer core means forming said quadrature mixer means, the mixer core means providing current signals on their respective path via the phase shifter means to the combiner means which sums the current signals to provide an output signal.

Where the transconductor means comprises a low voltage headroom transconductor having differential inputs and a relatively low gain, the arrangement may further comprise a high gain pre-amplifier arranged to receive an or the single-ended input signal and to provide amplified and phase-split signals therefrom to the different inputs of the transconductor means.

Preferably, any such image reject mixer arrangement is implemented as an integrated circuit, which may be the radioreceiver IC of a radiotelephone.

BRIEF DESCRIPTION OF THE DRAWINGS

An embodiment of the present invention will now be described with reference to the accompanying drawings, of which.

DETAILED DESCRIPTION OF THE PREFERRED EMBODIMENTS

Figure 1:
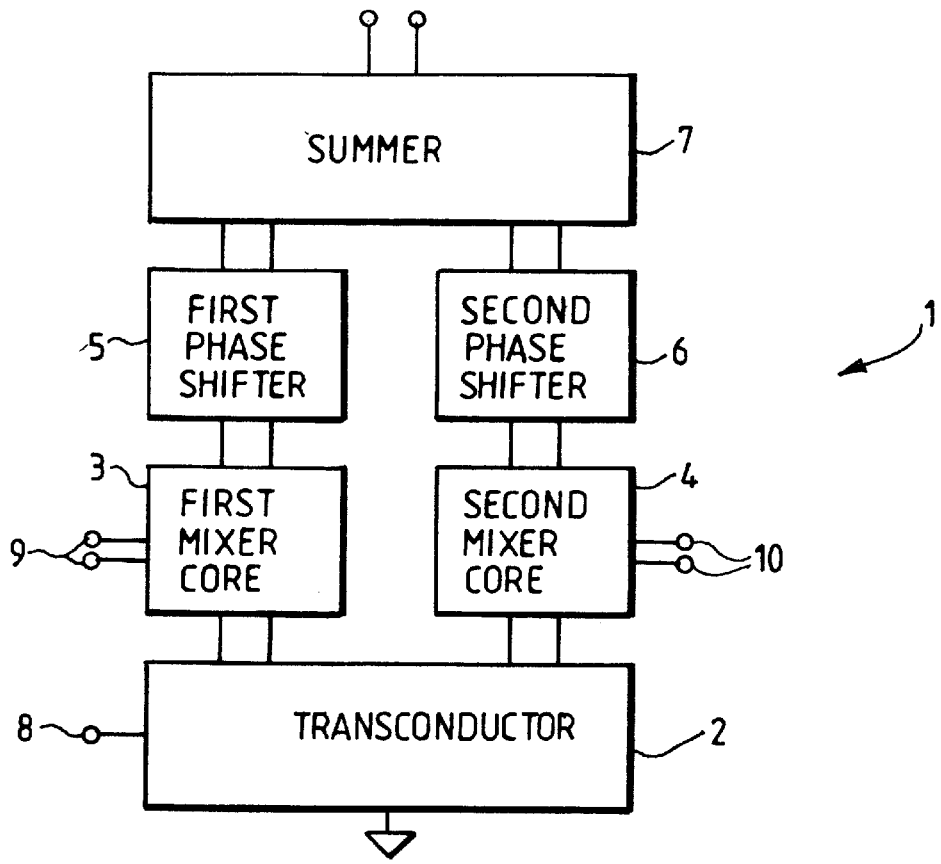
FIG. 1 shows an image reject mixer arrangement in accordance with the present invention.

Referring firstly to FIG. 1, the image reject mixer arrangement 1 comprises a transconductor 2, first and second mixer cores 3 and 4, first and second phase shifters 5 and 6 and a summer or combiner 7. The mixer arrangement 1 receives a single-ended RF voltage signal on a terminal 8, a differential local oscillator signal on I-LO terminals indicated at 9 and a 90° phase shifted differential local oscillator signal on Q-LO terminals 10, and provides differential IF output signals on output terminals 11.

The transconductor 2 is arranged to provide first and second differential current signals representative of the RF voltage signal received at the input terminal 18 to respective ones of the mixer cores 3 and 4. It is desirable to provide the transconductor 2 with a high output impedance, as this has a positive effect on the linearity characteristics and the noise figure of the image reject mixer arrangement 1.

Figure 2:
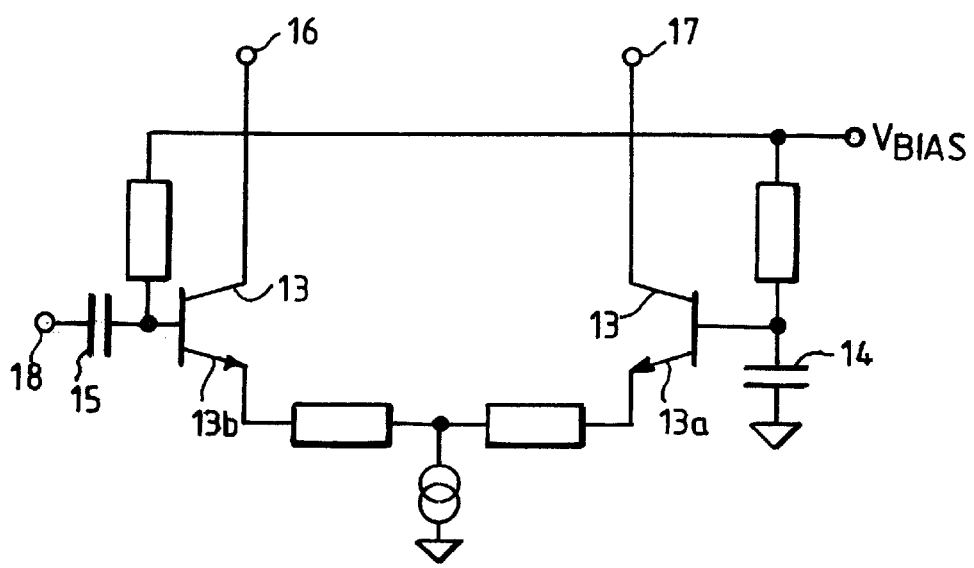
FIGS. 2 to 9 show circuits which may form part of the FIG. 1 image reject mixer arrangement.

FIG. 2 shows a differential transconductance amplifier stage 12 which may constitute the transconductor 2. In this transconductor, the base electrode of a first transistor 13a of an emitter-coupled pair 13 is AC grounded by a capacitor 14. An RF input signal, received at an input terminal 18, is AC coupled to the base electrode of the second transistor 13b of the pair 13 by a capacitor 15. Differential current signals are provided on output terminals 16, 17 representative of the voltage of a signal received on the input terminal 18.

Figure 3:
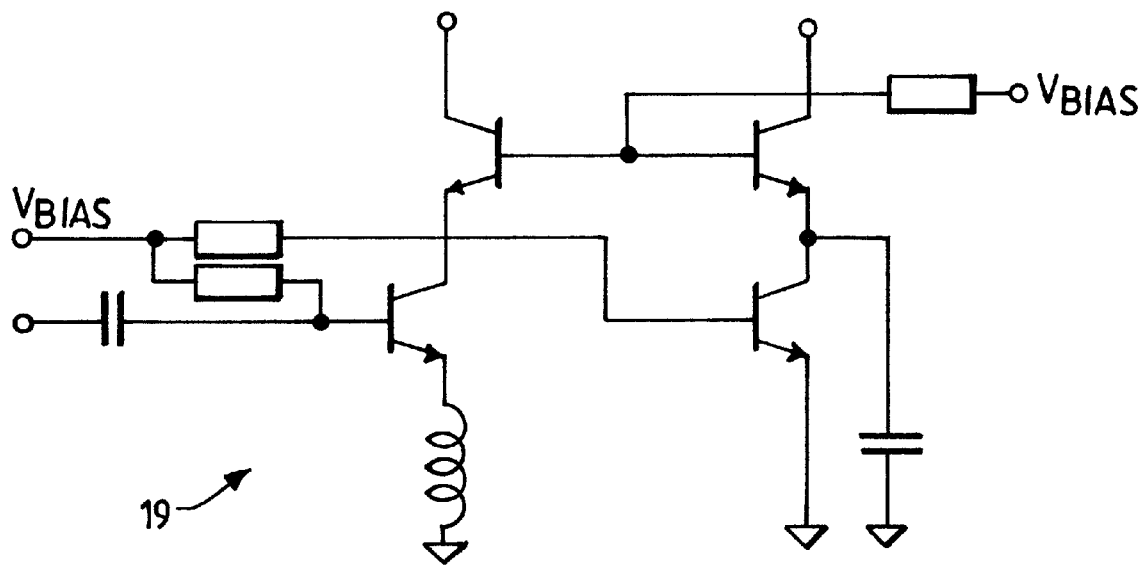

FIG. 3 shows a transconductor 19 which may alternatively constitute the transconductor 2. This transconductor 19 is the subject of UK Patent Application No. 9700487.3, from which application further details should be sought. The transconductor 19 is considered to be capable of superior linearity and noise properties to the transconductor 12 although it requires more voltage headroom than the transconductor 12 of FIG. 2 because it has two transistors in the main signal path.

Although the image reject mixer arrangement 1 of FIG. 1 is shown and stated to possess a single-ended input, the accommodation of a differential input signal requires modification only of the transconductor 2. Example transconductors 20, 31 suitable for this purpose are shown in respective ones of FIGS. 4 and 5.

Figure 4:
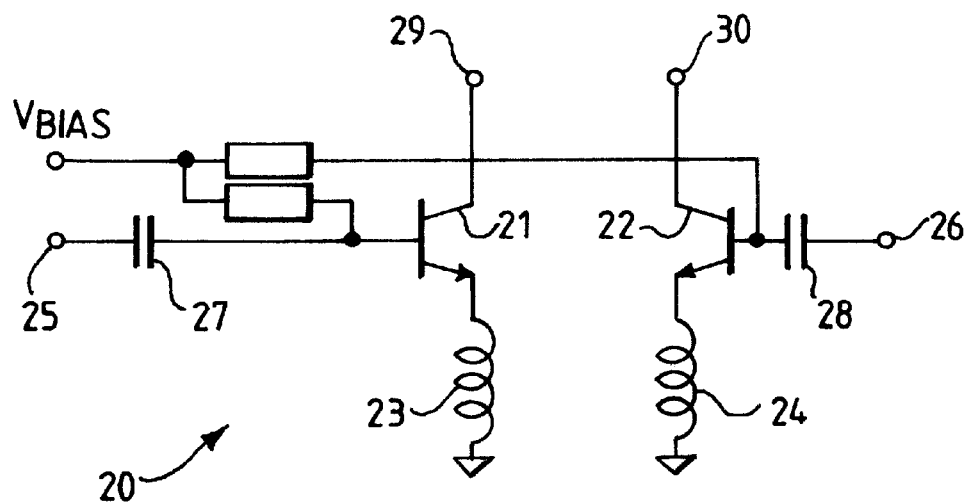

Referring to FIG. 4, a common emitter transconductor 20 suitable for constituting the transconductor 2 is shown comprising a pair of biased transistors 21, 22 emitter grounded by respective ones of inductors 23 and 24. Differential input signals received at respective ones of input terminals 25 and 26 are AC coupled to the base electrode of their respective transistor 21, 22 by respective ones of capacitors 27, 28. Differential current signals are provided at output terminals 29, 30 representative of the voltage of the input signal.

Figure 5:
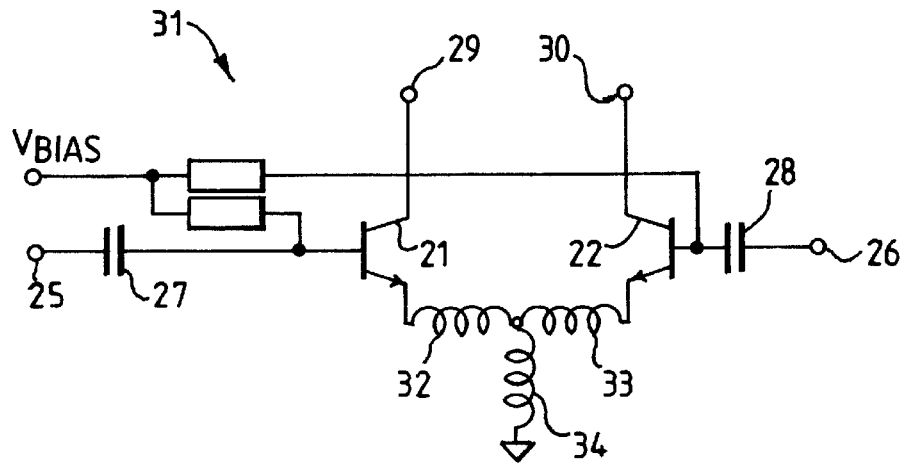

FIG. 5 shows a differential stage transconductor 31 also suitable for constituting the transconductor 2 comprising the same general configuration as the transconductor 20 of FIG. 4, from which reference numerals have been re-used for like elements, and inductors 32, 33 and 34. Here, the inductors 32 and 33 could be implemented by the parasitic properties of the packaging and/or bond wires of an integrated circuit on which the mixer arrangement 1 may be realised, although the inductor 34 is preferably an external, discrete component.

To implement any of the transconductors 12, 19, 20 and 31 as the transconductor 2 of FIG. 1, two such transconductors would usually be connected in parallel, with the input terminals of opposite transconductors commonly connected to receive the input signal. The transconductor 19 of FIG. 3 may alternatively be connected as shown in aforementioned UK Patent Application number 9700485.7, having a single amplification transistor and a pair of phase splitters.

Each of the transconductors 12, 19, 20 and 31 described above has the collector impedance of an npn transistor as its output impedance. This contributes to the linearity of the mixer arrangement 1.

From the output of the transconductor 2 to the output of the combiner 7, the image reject mixer arrangement 1 carries signals in what can be described as a "current mode", i.e. it is the current, not the voltage, which conveys the desired signal. In this current mode, it is seen to be advantageous to provide each active circuit block with a high output impedance and a low input impedance wherever possible. The mixer cores 3 and 4 therefore are preferably implemented each as a Gilbert cell mixer core, such as the one shown in FIG. 6.

Figure 6:
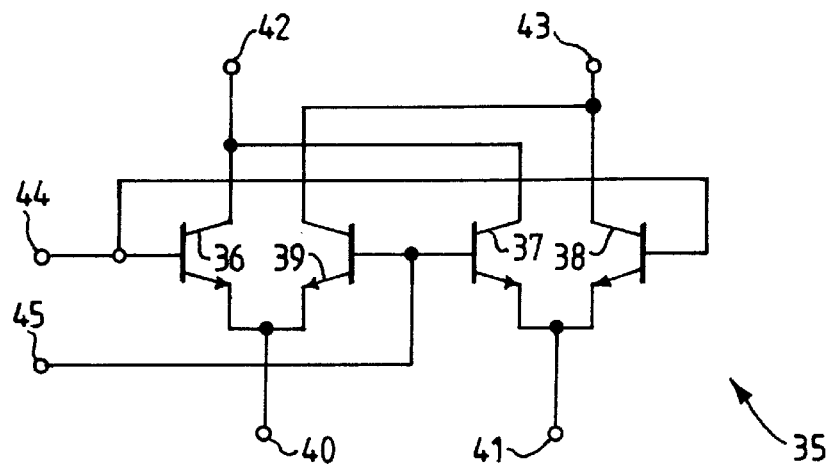

Referring to FIG. 6, the mixer core 35 comprises four mixer transistors 36–39, input terminals 40, 41, output terminals 42, 43, and local oscillator input terminals 44, 45. These terminals 44, 45 correspond either to the I-LO terminals 9 or to the Q-LO terminals 10 of FIG. 1. The input impedance of this mixer core 35 is low because it is defined by the emitter impedances of the transistors 36–39. Also, the output impedance is high because it is defined by the collector impedances of the transistors 36–39. The operation of the Gilbert cell mixer core will be understood by the skilled person although it should be noted that, because the emitters of the transistors 36–39 are cascode connected with the transistors of the transconductor 2, its use has a positive effect on the linearity characteristics and the overall noise figure of the mixer arrangement 1.

The phase shifters 5 and 6 of FIG. 1 are required to provide a relative phase shift of 90° between the output signals provided by their respective mixer core 3 and 4. This is achieved by selecting the phase shifter 5, associated with the mixer core 3 having an In-phase local oscillator signal applied thereto, to generate a +45° phase shift and selecting the phase shifter 6, associated with the mixer core 4 having a Quadrature local oscillator signal applied thereto, to generate a −45° phase shift. A phase shifter 46 suitable for these purposes is shown in FIG. 7.

Figure 7:
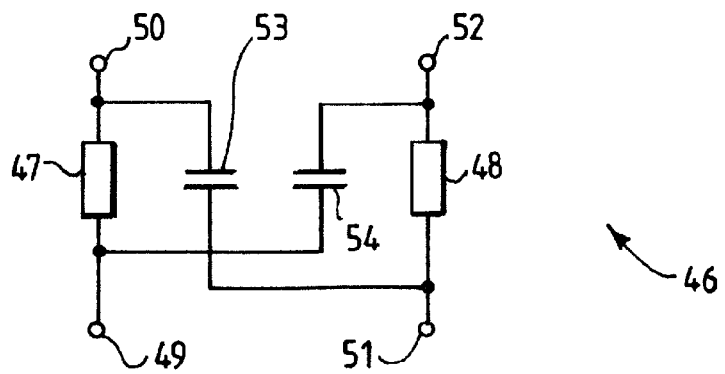

Referring to FIG. 7, the phase shifter 46 comprises first and second resistors 47 and 48 connected respectively between an input terminal 49 and an output terminal 50 and an input terminal 51 and an output terminal 52; and first and second capacitors 53 and 54 connected oppositely to the resistors 47, 48 across those terminals 49–52. This phase shifter 46, although operating in a current mode, is essentially the same as those phase shifters which are used in conventional, voltage mode, cascade image reject mixer arrangements.

Figure 8:
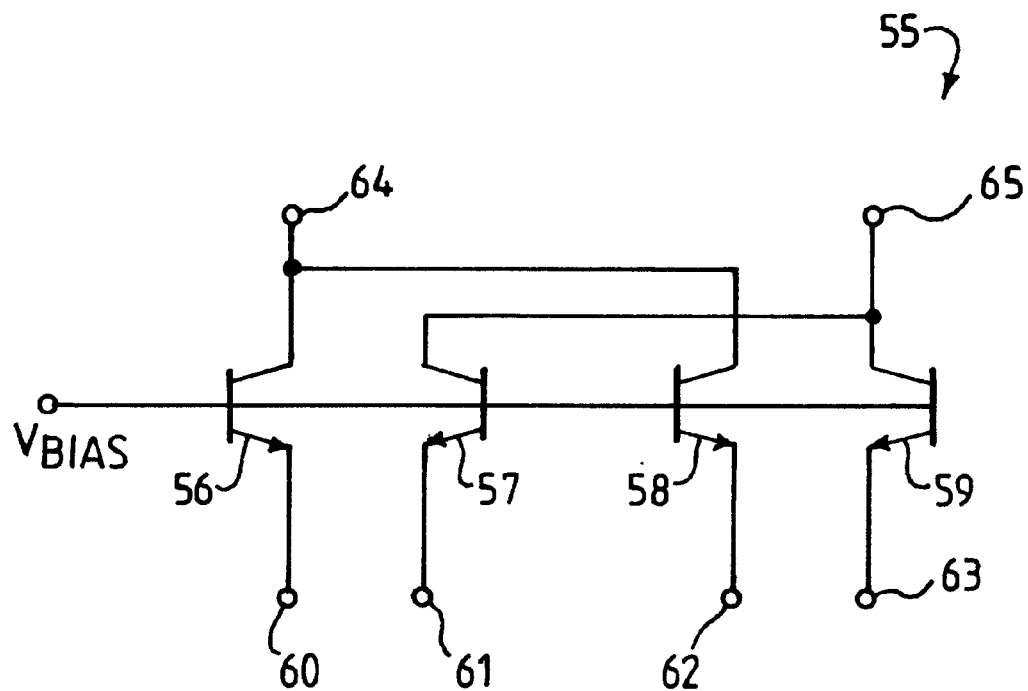

Referring now to FIG. 8, a combiner 55 suitable for use as the combiner 7 of FIG. 1 is shown comprising first to fourth biased transistors 56–59 having their emitter electrodes arranged to receive current signals provided by the phase shifters 5, 6 on input terminals 60–63, and to provide a differential output current signal on output terminals 64 and 65. The operation of the combiner 55 and the phase shifter 46 of FIG. 7 is discussed in the aforementioned UK Patent Application No. 9724435.4. An alternative combiner 66 is shown in FIG. 9.

Figure 9:
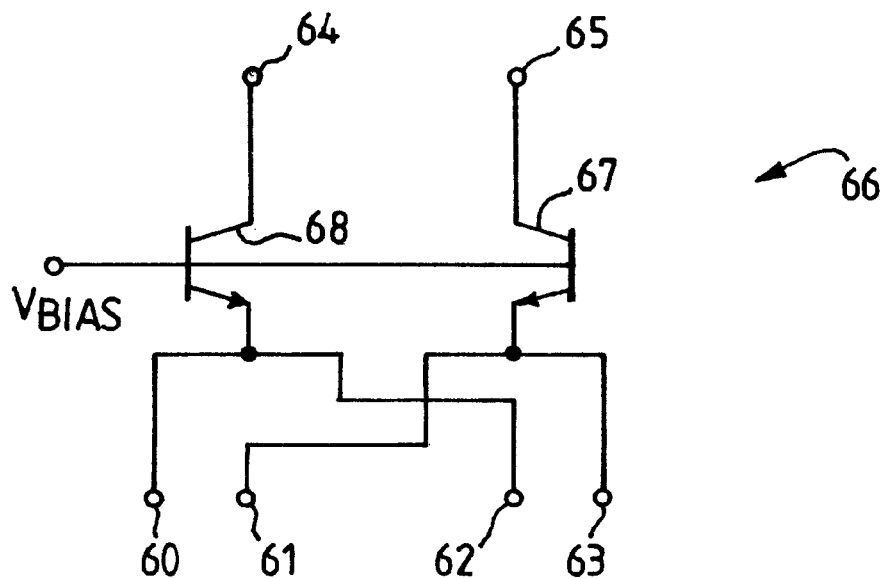

Referring now to FIG. 9, the combiner 66 comprises first and second biased transistors 67 and 68, and like input and output terminals to the combiner 55 of FIG. 8, from which reference numerals have been re-used for such terminals. This combiner 66 possesses a lower input impedance than the combiner 55 because current summation is made at the input (emitters) of the cascode connected transistors 67, 68. Suppression of image frequency signals is enhanced also because the DC current levels in each of the transistors 67, 68 is greater than the current levels obtained in the transistors 56–59 of the combiner 55.

With each of the above described combiners, unwanted image frequency signals are suppressed by summing the antiphase signals provided by the phase shifters 5 and 6. To this effect, the input terminals 60 and 61 are connected to the differential output terminals of the phase shifter 5 and the input terminals 62 and 63 are connected to the output terminals of the phase shifter 6. To effect a voltage signal from the output terminals 64 and 65, faithful to the differential current signal provided thereat, load resistors or inductors (not shown) will usually be connected between respective ones of these terminals 64, 65 and supply voltage.

The cascode connection of the transistors of the mixer cores 3 and 4 with the transistors of the combiner 7 which can be achieved by use of the present invention is advantageous in providing improved noise performance and linearity in comparison with cascade connected mixer arrangement circuit blocks, and reduced current consumption.

Although the embodiments have been described using first and second 45° phase shifters 5 and 6 connected to the outputs of respective ones of the mixer cores 3 and 4, it will be appreciated that the invention could be implemented instead with a phase shifter having a 90° phase shift connected to receive the output signals of one of the mixer cores 3, 4, whilst the output of the other mixer core 3, 4 is connected to an input of the combiner 7 by a non-phase shifting circuit or connection. The use of two separate phase shifters is preferred when the image reject mixer arrangement is to be implemented as an integrated circuit because such an arrangement is more tolerant to process variations than in the case where a single phase shifter is used.

To provide an image reject mixer arrangement which has the advantages of the FIG. 3 transconductor 19, with regard to noise properties and linearity characteristics, but does not have the voltage headroom requirements thereof, it is advantageous to use the transconductor 19 as a pre-amplifier stage. In this case, inductors or resistors (not shown) may be connected to the output terminals of the transconductor 19, to induce voltage signals thereat, and the differential voltage signals provided thereby can be used as the input signals of, for example, the common emitter transconductor 20 of FIG. 4. In this case, the transconductor pre-amplifier 19 can be arranged to provide high, substantially noiseless gain and the common emitter transconductor 20, which is driven by differential input signals, is able to provide low noise output signals of a required amplitude reproduced with high linearity at a DC voltage in the region of 0.5 to 0.8 Volts. Current consumption in this case, although slightly increased, will remain relatively low.

An image reject mixer, arrangement has been simulated using a pre-amplifier stage based on the transconductor 19 of FIG. 3 provided with resonant loads, the transconductor 20 of FIG. 4, the Gilbert cell mixer cores 35 and the phase shifters 46 of FIGS. 6 and 7 respectively, and the combiner 66 of FIG. 9 connected as shown at 1 in FIG. 1. The output terminals 11 were connected to a 2.7 Volts supply voltage by choke inductors and a 400 Ω resistor was connected between those terminals 11 in place of an IF filter which would usually be connected thereto. The mixer arrangement 1 was optimized for a 1000 MHz RF input signal and a 200 MHz IF output signal, and was simulated using a software RF simulator. The circuit arrangement displayed a gain of 21.3 dB and a noise figure of only 2.6 dB, good linearity characteristics (with an input-referred third order interception point of −13 dBm and an input-referred 1 dB compression point of −21 dBm), 50 dB image rejection and current consumption of 17 mA.

What is claimed is:

1. An image reject mixer circuit arrangement, comprising: a transconductor, a quadrature mixer, a phase shifter, and a combiner, the transconductor, quadrature mixer, phase shifter and the combiner being connected in series across a voltage supply, the transconductor providing first and second current signals on first and second paths respectively, each of the first and second current signals being representative of an input signal, to a respective one of an in-phase and a quadrature mixer core forming said quadrature mixer, the mixer core providing current signals on their respective path via the phase shifter to the combiner, which sums the current signals to provide an output signal.

2. The image reject mixer circuit arrangement in accordance with claim 1, in which each of the first and second paths includes a phase shifter circuit.

3. The image reject mixer circuit arrangement in accordance with claim 2, in which transistors forming part of the transconductor are connected in cascode with transistors forming part of the quadrature mixer.

4. The image reject mixer circuit arrangement in accordance with claim 3, in which transistors forming part of the quadrature mixer are connected in cascode with transistors forming part of the combiner.

5. The image reject mixer circuit arrangement in accordance with claim 4, in which the transconductor comprises a low voltage headroom transconductor having differential inputs and a relatively low gain, the arrangement further comprising a high gain pre-amplifier arranged to receive a single-ended input signal and to provide amplified and phase-split signals dependent thereon to the differential inputs of the transconductor.

6. The image reject mixer circuit arrangement in accordance with claim 3, in which the transconductor comprises a low voltage headroom transconductor having differential inputs and a relatively low gain, the arrangement further comprising a high gain pre-amplifier arranged to receive a single-ended input signal and to provide amplified and phase-split signals dependent thereon to the differential inputs of the transconductor.

7. The image reject mixer circuit arrangement in accordance with claim 2, in which transistors forming part of the quadrature mixer are connected in cascode with transistors forming part of the combiner.

8. The image reject mixer circuit arrangement in accordance with claim 7, in which the transconductor comprises a low voltage headroom transconductor having differential inputs and a relatively low gain, the arrangement further comprising a high gain pre-amplifier arranged to receive a single-ended input signal and to provide amplified and phase-split signals dependent thereon to the differential inputs of the transconductor.

9. The image reject mixer circuit arrangement in accordance with claim 2, in which the transconductor comprises a low voltage headroom transconductor having differential inputs and a relatively low gain, the arrangement further comprising a high gain pre-amplifier arranged to receive a single-ended input signal and to provide amplified and phase-split signals dependent thereon to the differential inputs of the transconductor.

10. The image reject mixer circuit arrangement in accordance with claim 1, in which transistors forming part of the transconductor are connected in cascode with transistors forming part of the quadrature mixer.

11. The image reject mixer circuit arrangement in accordance with claim 10, in which transistors forming part of the quadrature mixer are connected in cascode with transistors forming part of the combiner.

12. The image reject mixer circuit arrangement in accordance with claim 11, in which the transconductor comprises a low voltage headroom transconductor having differential inputs and a relatively low gain, the arrangement further comprising a high gain pre-amplifier arranged to receive a single-ended input signal and to provide amplified and phase-split signals dependent thereon to the differential inputs of the transconductor.

13. The image reject mixer circuit arrangement in accordance with claim 10, in which the transconductor comprises a low voltage headroom transconductor having differential inputs and a relatively low gain, the arrangement further comprising a high gain pre-amplifier arranged to receive a single-ended input signal and to provide amplified and phase-split signals dependent thereon to the differential inputs of the transconductor.

14. The image reject mixer circuit arrangement in accordance with claim 1, in which transistors forming part of the quadrature mixer are connected in cascode with transistors forming part of the combiner.

15. The image reject mixer circuit arrangement in accordance with claim 14, in which the transconductor comprises a low voltage headroom transconductor having differential inputs and relatively low gain, the arrangement further comprising a high gain pre-amplifier arranged to receive a single-ended input signal and to provide amplified and phase-split signals dependent thereon to the differential inputs of the transconductor.

16. The image reject mixer circuit arrangement in accordance with claim 1, in which the transconductor comprises a low voltage headroom transconductor having differential inputs and a relatively low gain, the arrangement further comprising a high gain pre-amplifier arranged to receive a single-ended input signal and to provide amplified and phase-split signals dependent thereon to the differential inputs of the transconductor.

17. The image reject mixer circuit arrangement in accordance with claim 1, implemented as an integrated circuit.

18. A radio receiver having an image reject mixer circuit arrangement in accordance with claim 1.

19. A radiotelephone having the radio receiver in accordance with claim 18.

20. An image reject mixer circuit arrangement, comprising: a transconductor, a quadrature mixer, a current mode phase shifter, and a combiner, the transconductor, quadrature mixer, current mode phase shifter and the combiner being connected in series across a voltage supply, the transconductor providing first and second current signals on first and second paths respectively, each of the first and second current signals being representative of an input signal, to a respective one of an in-phase and a quadrature current mode mixer core forming said quadrature mixer, each mixer core providing current signals on their respective path via the current mode phase shifter to the combiner, which sums the current signals to provide an output current signal.

* * * * *